(12) United States Patent
Kamezawa et al.

(10) Patent No.: US 9,986,185 B2
(45) Date of Patent: May 29, 2018

(54) SEMICONDUCTOR INTEGRATED CIRCUIT AND IMAGE CAPTURING APPARATUS

(71) Applicants: Sho Kamezawa, Osaka (JP); Tohru Kanno, Kanagawa (JP); Yuuya Miyoshi, Osaka (JP)

(72) Inventors: Sho Kamezawa, Osaka (JP); Tohru Kanno, Kanagawa (JP); Yuuya Miyoshi, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days. days.

(21) Appl. No.: 15/447,281

(22) Filed: Mar. 2, 2017

(65) Prior Publication Data
US 2017/0264844 A1 Sep. 14, 2017

(30) Foreign Application Priority Data

Mar. 9, 2016 (JP) .................................. 2016-045109
Dec. 28, 2016 (JP) .................................. 2016-255001

(51) Int. Cl.
*H04N 5/369* (2011.01)
*H03K 17/687* (2006.01)
*H04N 5/378* (2011.01)

(52) U.S. Cl.
CPC ......... *H04N 5/3698* (2013.01); *H03K 17/687* (2013.01); *H04N 5/378* (2013.01)

(58) Field of Classification Search
None
See application file for complete search history.

(56) References Cited

U.S. PATENT DOCUMENTS

| | | | | |
|---|---|---|---|---|
| 8,563,916 B2 * | 10/2013 | Lotto | ...................... | H03F 3/505 250/208.1 |
| 9,148,590 B2 * | 9/2015 | Ishibashi | ................ | H04N 5/335 |
| 9,712,769 B2 * | 7/2017 | Komaba | .............. | H04N 5/3698 |
| 9,800,843 B2 * | 10/2017 | Lim | ....................... | H04N 9/045 |
| 9,838,626 B2 * | 12/2017 | Nagai | .................... | H04N 5/363 |

FOREIGN PATENT DOCUMENTS

JP 2013-051527 3/2013

* cited by examiner

*Primary Examiner* — James Hannett
(74) *Attorney, Agent, or Firm* — Cooper & Dunham LLP

(57) ABSTRACT

A semiconductor integrated circuit includes multiple signal processing circuits including a constant current source, a first bias source that generates first bias voltage, a second bias source that generates second bias voltage, a first bias circuit that supplies a first reference current to the first bias source, a second bias circuit that supplies a second reference current to the second bias source, a bias wiring that supplies the first bias voltage and the second bias voltage to a plurality of gates of a transistor that constructs the constant current source, a power source wiring that supplies a power source voltage to each of the first bias source, the second bias source, and the constant current source, a first voltage supplying source that applies a first power source voltage to the power source wiring, and a second voltage supplying that applies a second power source voltage to the power source wiring.

6 Claims, 8 Drawing Sheets

US 9,986,185 B2

SEMICONDUCTOR INTEGRATED CIRCUIT AND IMAGE CAPTURING APPARATUS

CROSS-REFERENCE TO RELATED APPLICATION

This patent application is based on and claims priority pursuant to 35 U.S.C. § 119(a) to Japanese Patent Applications No. 2016-045109, filed on Mar. 9, 2016 and No. 2016-255001, filed on Dec. 28, 2016 in the Japan Patent Office, the entire disclosure of which is hereby incorporated by reference herein.

BACKGROUND

Technical Field

The present invention relates to a semiconductor integrated circuit and an image capturing apparatus.

Background Art

Complementary metal oxide semiconductor (CMOS) linear color image sensors as solid-state image sensors are widely used for various image capturing apparatuses such as digital cameras and multifunction peripherals (MFPs) etc. In the CMOS linear color image sensors, for example, each of multiple photo diodes laid out in multiple rows extending in one direction, picks up signals generated through photoelectric conversion in chronological order.

The picked up signals are applied with operations such as amplification and analog/digital conversion by multiple, row signal processing circuits (signal processing circuits), which are laid out in column per one or more pixels. The row signal processing circuit includes an amplifier etc. In the signal processing circuit, bias current is supplied by a constant current power supply provided for each of the signal processing circuits. As a result, in the known image capturing apparatuses, in order to stabilize the constant current power supply that supplies bias current to each of the multiple signal processing circuit, power source wiring connected to the constant current circuit constructed by a current mirror circuit is electrically separated from power source wiring connected to circuits other than the constant current power supplying circuit such as the amplifier etc.

SUMMARY

Example embodiments of the present invention provide a novel semiconductor integrated circuit includes multiple signal processing circuits arranged in row along one direction including a constant current source, a first bias source disposed at one end of the row of the multiple signal processing circuits that generates first bias voltage in accordance with supplied current, a second bias source disposed at another end of the row of the multiple signal processing circuits that generates second bias voltage in accordance with supplied current, a first bias circuit that supplies a first reference current to the first bias source, a second bias circuit that supplies a second reference current to the second bias source, a bias wiring that supplies the first bias voltage and the second bias voltage to a plurality of gates of a transistor that constructs the constant current source, a power source wiring that supplies a power source voltage to each of the first bias source, the second bias source, and the constant current source, a first voltage supplying source disposed at the one end of the row of the multiple signal processing circuits that applies a first power source voltage to the power source wiring, and a second voltage supplying source disposed at the other end of the row of the multiple signal processing circuits that applies a second power source voltage to the power source wiring.

BRIEF DESCRIPTION OF THE DRAWINGS

A more complete appreciation of the disclosure and many of the attendant advantages thereof will be readily obtained as the same becomes better understood by reference to the following detailed description when considered in conjunction with the accompanying drawings.

Figure 1:
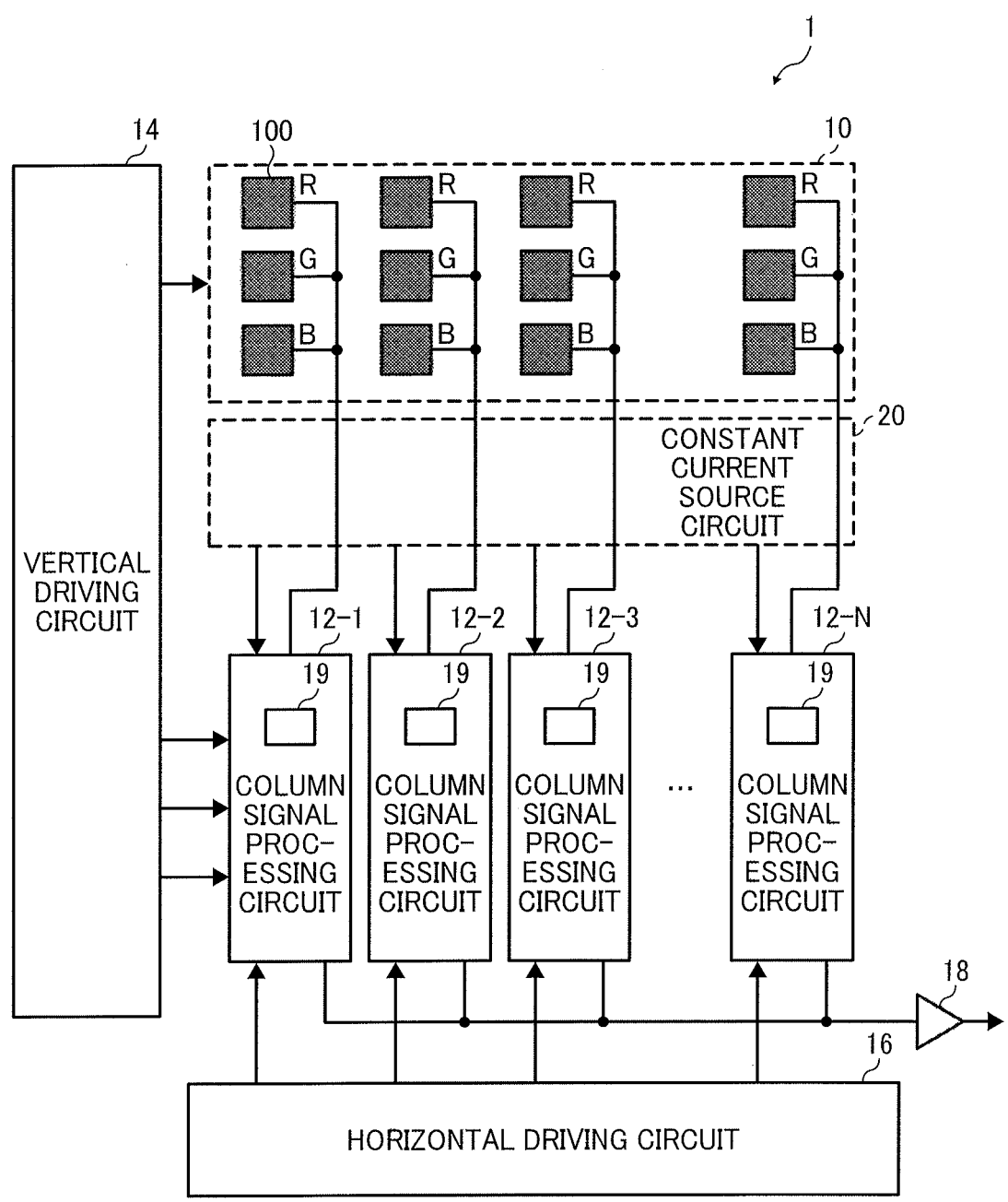
FIG. 1 is a schematic diagram illustrating a configuration of a semiconductor integrated circuit as an embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

A more complete appreciation of the disclosure and many of the attendant advantages thereof will be readily obtained as the same becomes better understood by reference to the following detailed description when considered in conjunction with the accompanying drawings.

Embodiments of the present invention are described below in detail with reference to figures. In figures, same symbols are assigned to same or corresponding parts, and their descriptions are simplified or omitted appropriately.

First Embodiment

A semiconductor integrated circuit and an image capturing apparatus are described below in detail with reference to figures. FIG. 1 is a schematic diagram illustrating a configuration of a semiconductor integrated circuit 1 in this embodiment. An example of the semiconductor integrated circuit 1 is a CMOS linear color image sensor. As illustrated in FIG. 1, the semiconductor integrated circuit 1 includes a pixel unit 10, N row signal processing circuits (signal processing circuits) 12-1 to 12-N, a constant current source circuit 20, a vertical driving circuit 14, a horizontal driving circuit 16, and an output unit 18. In case of referring to any arbitrary one of the multiple row signal processing circuits 12-1 to 12-N etc., it is simply referred to as the row signal processing circuit 12.

In the pixel unit 10, multiple pixels 100 each capable of receiving light in any one of R, G, and B colors for photoelectric conversion are arranged in one direction (i.e., main scanning direction) for each of the colors R, G, and B. Each of the signal processing circuits 12-1 to 12-N is provided for three pixels 100 of R, G, and B colors that are arranged in the column direction (i.e., sub-scanning direction) for photoelectric conversion. Each of the row signal processing circuits 12-1 to 12-N samples both reset signals (reset levels) and light signals (data signals) output by the pixel unit 10. The row signal processing circuits 12-1 to 12-N perform at least any one of analog signal process, correlated double sampling (CDS) process, analog/digital conversion, and digital signal process on each of the sampled signals. The output unit 18, which may be an output amplifier, functions as a buffer that temporarily stores image data processed by each of the row signal processing circuits 12-1 to 12-N.

Each of the row signal processing circuits 12-1 to 12-N includes, for example, an amplifier 19 inside. Constant current as bias current is supplied to the amplifier 19 etc. in each one of the row signal processing circuits 12-1 to 12-N by the constant current source circuit 20. Just like the multiple pixels 100 in the pixel unit 10, the row signal processing circuits 12-1 to 12-N are arranged in one direction to form rows of signal processing circuit.

The vertical driving circuit 14 controls timing that the pixel unit 10 and the row signal processing circuits 12-1 to 12-N operate. The horizontal driving circuit 16 controls timing when image data is read from each of the row signal processing circuits 12-1 to 12-N. The output unit 18 adjusts timing such that the image data read from the row signal processing circuits 12-1 to 12-N are output to the latter signal processing circuit at appropriate timing.

The semiconductor integrated circuit 1 as the CMOS linear color image sensor captures images in units of line while changing its relative position against a target object, and amplifies and outputs a signal charge that is obtained through photoelectric conversion for each pixel 100.

Figure 2:
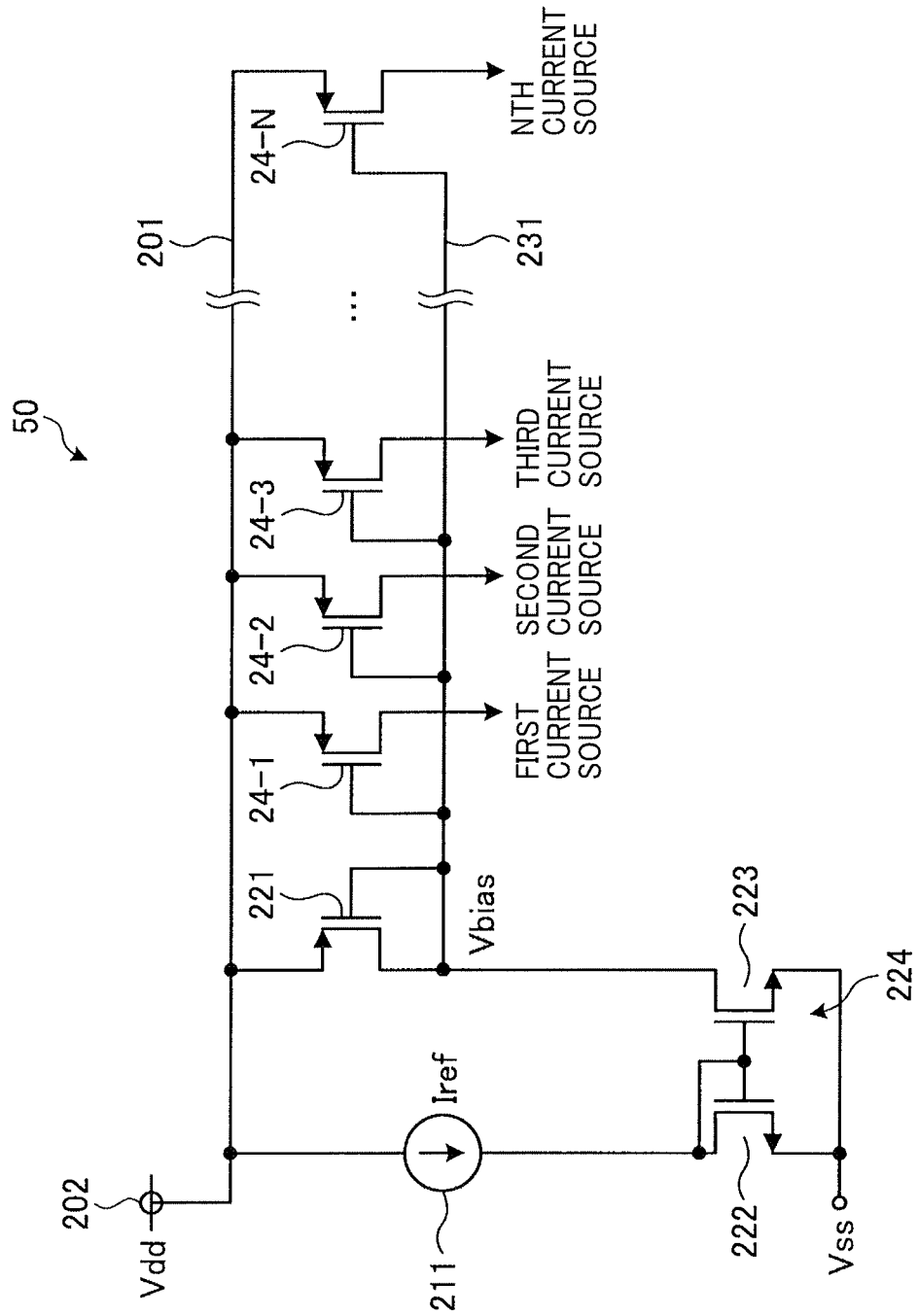
FIG. 2 is a diagram illustrating a constant current source circuit according to a comparative example.

Here, before describing the constant current source circuit 20 in this embodiment, the related art constant current source circuit is described below as a comparative example. FIG. 2 is a diagram illustrating the constant current source circuit 50 according to the comparative example. As illustrated in FIG. 2, in the constant current source circuit 50, one terminal out of two terminals of a reference current source 211 that supplies reference current Iref is connected to a power source wiring 201 to supply power source voltage Vdd. In addition, in the constant current source circuit 50, another terminal of the reference current source 211 is connected to a drain electrode and a gate electrode of a second transistor 222 and a gate electrode of a third transistor 223.

In the constant current source circuit 50, source electrodes of the second transistor 222 and the third transistor 223 are connected to a ground potential Vss. In the constant current source circuit 50, a drain electrode of the third transistor 223 is connected to a drain electrode and a gate electrode of the first transistor 221 and a bias wiring 231. In the constant current source circuit 50, the bias wiring is connected to each of gate electrodes of constant current source transistors (constant current sources) 24-1 to 24-N laid out for each row.

In the constant current source circuit 50, source electrodes of the first transistor 221 and the constant current source transistors 24-1 to 24-N are connected to a ground potential Vss. In the constant current source circuit 50, via a current mirror circuit 224 constructed by the second transistor 222 and the third transistor 223, output current in accordance with the reference current Iref is supplied to the first transistor 221. The first transistor 221 determines bias voltage Vbias in accordance with the supplied output current.

In the constant current source circuit 50, the bias voltage Vbias determined by the first transistor 221 is applied to the gate electrodes of the constant current source transistors 24-1 to 24-N via the bias wiring 231. The constant current source transistors 24-1 to 24-N construct a constant current source that flows current determined by difference between the bias voltage Vbias and power source voltage Vdd, i.e., voltage between gate and source of a transistor Vgs. In the constant current source circuit 50, the constant current source constructed by each of the constant current source transistors 24-1 to 24-N is connected to a load circuit (e.g., the amplifier 19) via the current mirror circuit 224. That is, the constant current transistors 24-1 to 24-N construct a first current source to a Nth current source.

Here, if the semiconductor integrated circuit 1 is a linear sensor, several thousand to several tens of thousands pixels 100 is laid out in one direction (in the main scanning direction), and the semiconductor integrated circuit 1 has a slim shape. As a result, in the semiconductor integrated circuit 1 as the linear sensor, it is required to lay out the long power source wiring in the longitudinal direction, and wiring resistance becomes larger in proportion to the length of wiring.

Therefore, IR drop calculated by multiplying current I that flows through the power source wiring by the wiring resistance R becomes considerable. More specifically, voltage drop amount increases towards an end of the power supply wiring (i.e., the Nth current source side) apart from the power supply voltage source 202 that supplies power source voltage Vdd, and power supply voltage decreases by just that much. As a result, while the bias voltage Vbias determined by the first transistor 221 is kept constant in all rows, the power source voltage Vdd decreases gradually (i.e., Vgs decreases gradually), and a current value from the current source decreases in proportion to (Vgs-Vth)$^2$. Therefore, in the constant current source circuit 50 illustrated in FIG. 2, a gap between the current value from the constant current source and ideal current value regarding the signal processing circuit row becomes large.

Figure 3:
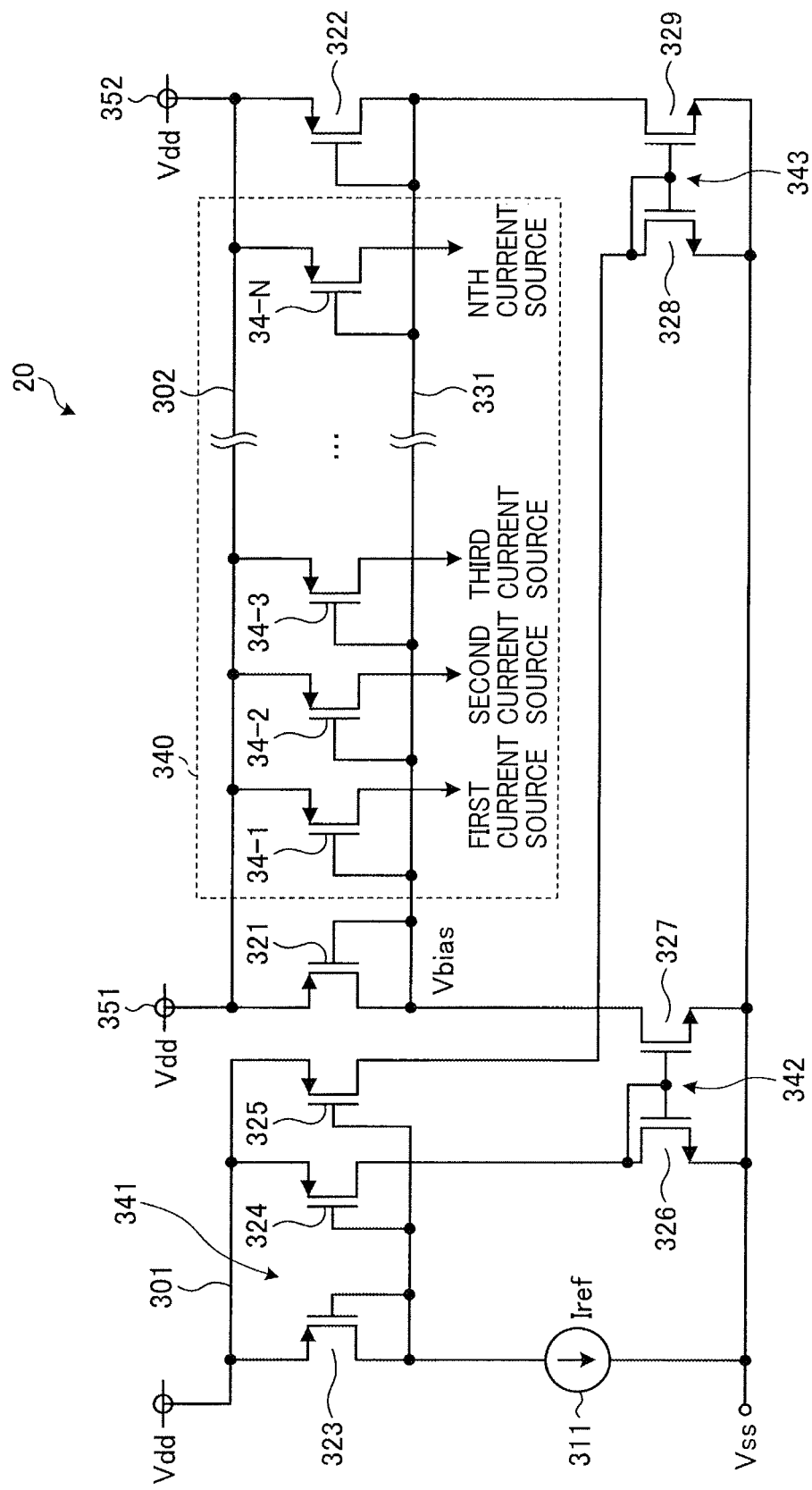
FIG. 3 is a diagram illustrating a configuration of a constant current source circuit included in the semiconductor integrated circuit of FIG. 1 as an embodiment of the present invention.

Next, a constant current source circuit 20 in this embodiment is described below. FIG. 3 is a diagram illustrating a configuration of the constant current source circuit 20 included in the semiconductor integrated circuit 1 in this embodiment. As illustrated in FIG. 3, the constant current source circuit 20 is constructed by constant current source transistors (constant current sources) 34-1 to 34-N using PMOS transistors. In the constant current source circuit 20, one terminal out of two terminals of a reference current source 311 that supplies reference current Iref is connected to a ground potential Vss, and the other terminal is connected to a drain electrode and a gate electrode of a third transistor 323, a gate electrode of a fourth transistor 324, and a gate electrode of a fifth transistor 325.

In the constant current source circuit 20, each of source electrodes of the third transistor 323, the fourth transistor 324, and the fifth transistor 325 is connected to a first power source wiring 301 to be supplied power source voltage Vdd by a first voltage supplying source 351. In the constant current source circuit 20, the first voltage supplying source 351 that supplies power source voltage Vdd is located at one side of the constant current source transistors (constant current sources) 34-1 to 34-N, and power source voltage is applied to a second power source wiring 302. In addition, in the constant current source circuit 20, a second voltage supplying source 352 that supplies power source voltage Vdd is located at the other side of the constant current source transistors (constant current sources) 34-1 to 34-N, and power source voltage is applied to the second power source wiring 302. Here, the constant current source transistors (constant current sources) 34-1 to 34-N are referred to as a row signal processing current source 340.

In the constant current source circuit 20, a drain electrode of the fourth transistor 324 is connected to a drain electrode and a gate electrode of the sixth transistor 326 and a gate electrode of the seventh transistor 327. Likewise, in the constant current source circuit 20, a drain electrode of the fifth transistor 325 is connected to a drain electrode and a gate electrode of the eighth transistor 328 and a gate electrode of the ninth transistor 329.

In the constant current source circuit 20, drain electrodes of the seventh transistor 327 and the ninth transistor 329 are connected to the drain electrode and gate electrode of the first transistor 321, the drain electrode and gate electrode of the second transistor 322, and the bias wiring 331. In the constant current source circuit 20, the bias wiring 331 is connected to each of gate electrodes of the constant current source transistors (constant current sources) 34-1 to 34-N laid out for each of the row signal processing circuits 12-1 to 12-N.

In the constant current source circuit 20, source electrodes of the six transistor 326, the seventh transistor 327, the eighth transistor 328, and the ninth transistor 329 are connected to a ground potential Vss. In the constant current source circuit 20, each of source electrodes of the first transistor 321, the second transistor 322, and the constant current source transistors 34-1 to 34-N is connected to a second power source wiring 302 to be supplied with power source voltage Vdd by a second voltage supplying source 352.

In the constant current source circuit 20, the first voltage supplying source 351 that supplies power source voltage Vdd is directly connected to the drain electrode of the eighth transistor 328. Likewise, in the constant current source circuit 20, the second voltage supplying source 352 that supplies power source voltage Vdd is directly connected to the drain electrode of the ninth transistor 329. The first power source wiring 301 is a power source wiring used globally. The second power source wiring 302 is used as a power source wiring that supplies power source voltage Vdd to the constant current source circuit 20 (i.e., the constant current source transistor 34-1 to 34-N, the first transistor 321, and the second transistor 322). In addition, the second power sour wiring 302 is laid out independently from other power source wiring such as the first power source wiring 301.

In the constant current source circuit 20, the third transistor 323, the fourth transistor 324, and the fifth transistor 325 construct a multiple-output first current mirror circuit 341. In addition, in the constant current source circuit 20, the sixth transistor 326 and the seventh transistor 327 construct a second current mirror circuit (first bias circuit) 342, and the eighth transistor 328 and the ninth transistor 329 construct a third current mirror circuit (second bias circuit) 343. It should be noted that input to the current mirror circuits 341 to 343 is provided by flowing current. Therefore, even if the wires become longer, that is not affected by resistance, and transmission loss is kept smaller.

The second current mirror circuit 342 is located at one side of the array of the row signal processing circuits 12-1 to 12-N (signal processing circuit rows) and supplies copied reference current to the first transistor 321 (first bias source). The third current mirror circuit 34e is located at the other side of the array of the row signal processing circuits 12-1 to 12-N (signal processing circuit rows) and supplies copied reference current to the second transistor 322 (second bias source). The first transistor 321 and the second transistor 322 generate bias voltage Vbias in accordance with the supplied current.

In the constant current source circuit 20, the bias voltage Vbias determined by the first transistor 321 and the second transistor 322 is applied to the gate electrodes of the constant current source transistors 34-1 to 34-N via the bias wiring 331. The constant current source transistors 34-1 to 34-N construct a constant current source that flows current determined by difference between the bias voltage Vbias and power source voltage Vdd, i.e., voltage between gate and source of a PMOS transistor Vgs. In the constant current source circuit 20, the constant current source constructed by each of the constant current source transistors 34-1 to 34-N is connected to a load circuit (row signal processing circuits 12-1 to 12-N) via the current mirror circuits 342 and 343. That is, the constant current transistors 34-1 to 34-N construct a first current source to a Nth current source.

As described above, by locating the first voltage supplying source 351 and the second voltage supplying source 352 at both ends of the array of the constant current source transistors 34-1 to 34-N, a current value that flows from each of the voltage supplying sources 351 and 352 is reduced to half. As a result, in the constant current source circuit 20, it is possible to reduce IR drop calculated by multiplying current I that flows through the power source wiring by wiring resistance R drastically. Furthermore, in the constant current source circuit 20, by laying out the current mirror circuits 342 and 343 at both ends, even if a voltage value of the power supplying source 351 differs from a voltage value of the power supplying source 352 due to any cause, it is possible to keep slippage between current that flows from the constant current source and the ideal current value small.

If current flows through the bias wiring 331, IR drop is generated. Therefore, wiring resistance of the bias wiring 331 is designed allowing a large margin. For example, width of the wiring is designed short.

Figure 4:
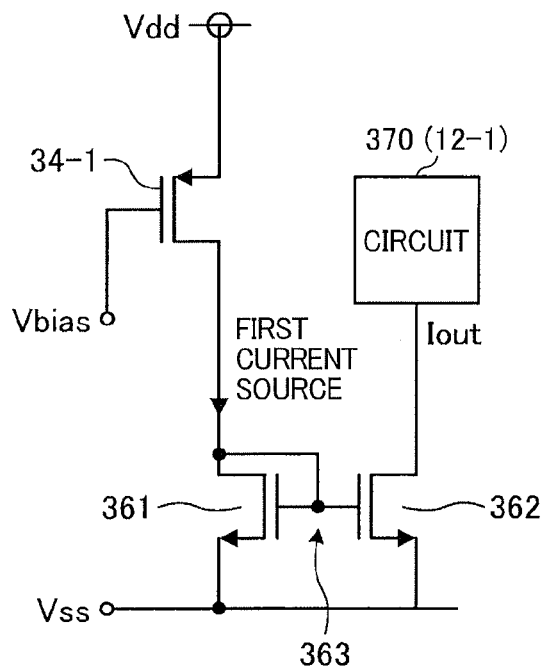
FIG. 4 is an exemplary diagram illustrating a configuration of a post-circuit for current source as an embodiment of the present invention.

FIG. 4 is an exemplary diagram illustrating a configuration of a post-circuit for current source in this embodiment. An example of a configuration of a latter circuit of the constant current source transistor (constant current source) 34-1 is illustrated in FIG. 4. As illustrated in FIG. 4, a drain electrode of the constant current source transistor 34-1 that constructs the first current source is connected to a gate electrode and a drain electrode of the transistor 361 that constructs the current mirror circuit 363 and a gate electrode of the transistor 362.

Bias voltage Vbias is applied to a gate electrode of the constant current source transistor 34-1 that constructs the first current source so that the reference current Iref flows. Assuming a size ratio of the transistor 361 as $(W/L)_1$ and a size ratio of the transistor 362 as $(W/L)_2$, bias current Iout is calculated as follows.

$$\text{Iout} = (W/L)_2/(W/L)_1 * \text{Iref} \tag{1}$$

It should be noted that the bias current Iout becomes bias current for a latter load circuit (row signal processing circuit 12-1) 370. In addition, in order to keep IR drop on the second power source wiring 302 small, the reference current Iref is configured as small as possible. As described in Equation (1) above, the bias current Iout is multiplied several times to several dozen times by $(W/L)_2/(W/L)_1$. As described above, the constant current source transistor 34-1 that constructs the first current source supplies current to the load circuit (row signal processing circuit 12-1) 370 via the current mirror circuit 363 constructed by two transistors 361 and 362 whose size ratio is configured so that output current becomes larger than input current.

Figure 5:
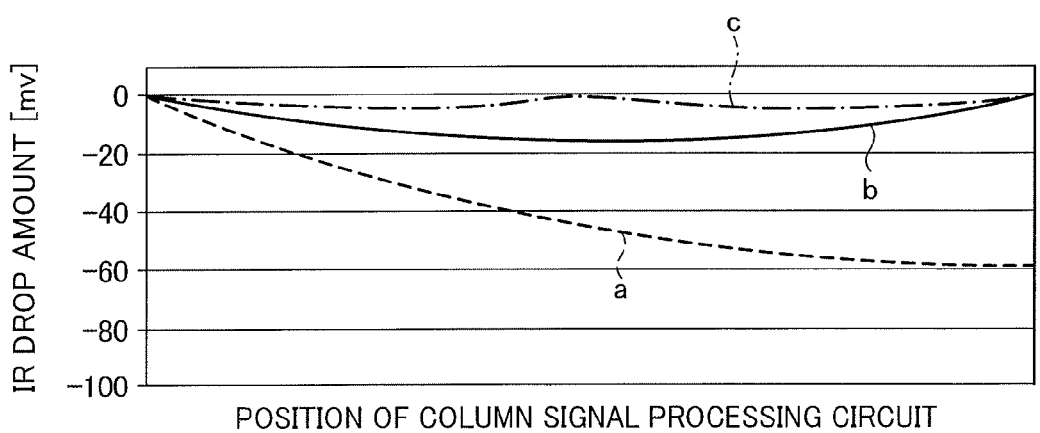
FIG. 5 is a diagram illustrating IR drop amount due to the constant current source circuit in the semiconductor integrated circuit as an embodiment of the present invention.

FIG. 5 is a diagram illustrating IR drop amount due to the constant current source circuit 20 in the semiconductor integrated circuit 1 in this embodiment. More specifically, in FIG. 5, output current of each of the current mirror circuits 341 to 343 in the constant current source circuit 20 and IR drop generated on the power source wiring when the reference current Iref flows through the constant current source for each row of the row signal processing circuits 12-1 to 12-N are illustrated.

Here, a indicates IR drop amount due to the constant current source circuit 50 illustrated in FIG. 2 by way of comparison, b indicates IR drop amount due to the constant current source circuit 20 illustrated in FIG. 3, and c indicates IR drop amount in case of adding a voltage supplying source at the center of the row signal processing circuit 12-1 to 12-N in addition to both ends of the row signal processing circuit 12-1 to 12-N as reference.

In the configuration of the constant current source circuit 50 by way of comparison, one power supply voltage source 202 that supplies power source voltage Vdd is located at the left side. As illustrated in a in FIG. 5, in case of using the constant current source circuit 50, IR drop amount increases as the array of the row signal processing circuit 12 gets away from the power supply voltage source 202. As illustrated in FIG. 5, in the constant current source circuit 50, the maximum value of IR drop is equal to 58.5 mV.

By contrast, in the constant current source circuit 20 of the semiconductor integrated circuit 1 in this embodiment, each of the first voltage supplying source 351 and the second voltage supplying source 352 is located on both ends of the row signal processing circuit 12-1 to 12-N (as illustrated in FIG. 3). As a result, by adopting the constant current source circuit 20, as illustrated in b in FIG. 5, while IR drop amount becomes large at the center of the chart, the maximum value of IR drop is equal to 16.2 mV. That is, in the constant current source circuit 20 of the semiconductor integrated circuit 1 in this embodiment, compared to the constant current source circuit 50 by way of comparison, it is possible to reduce the IR drop amount to one-fourth approximately.

In case of locating the voltage supplying source at the center of the row signal processing circuit 12-1 to 12-N in addition to both ends of the row signal processing circuit 12-1 to 12-N illustrated as reference, the IR drop amount is further reduced, and the IR drop amount is equal to 4.45 mV as illustrated in c in FIG. 5. In this case, compared to the constant current source circuit 50 by way of comparison, it is possible to reduce the IR drop amount to one-thirteenth approximately.

As described above, in the semiconductor integrated circuit 1, each of the first voltage supplying source 351 and the second voltage supplying source 352 is located at both ends of the array of the constant current source transistors 34-1 to 34-N, and multiple constant current sources constructed for each of the constant current source transistors 34-1 to 34-N is connected to the load circuit (e.g., the amplifier 19) via the current mirror circuits 342 and 343. In addition, in the semiconductor integrated circuit 1, the second power source wiring 302 connected to the constant current source circuit 20 is electrically separated from the first power source wiring connected to circuits other than the constant current source circuit 20. As a result, in the semiconductor integrated circuit 1, it is possible to reduce the current value that flows through the power source wiring by separating the current, reduce the decrease of the current value due to the effect of the IR drop, and supply each constant current source included in the constant current source circuit 20 stably.

In addition, in the semiconductor integrated circuit 1, the current mirror circuits (bias source) 342 and 343 for copying the reference current and the voltage supplying sources 351 and 352 are located at both ends of the constant current source transistors 34-1 to 34-N. As a result, it is possible to equalize the power source voltage Vdd and voltage Vgs on both ends of the constant current source transistors 34-1 to 34-N and equalize the current value that flows from the current source.

First modification

Figure 6:
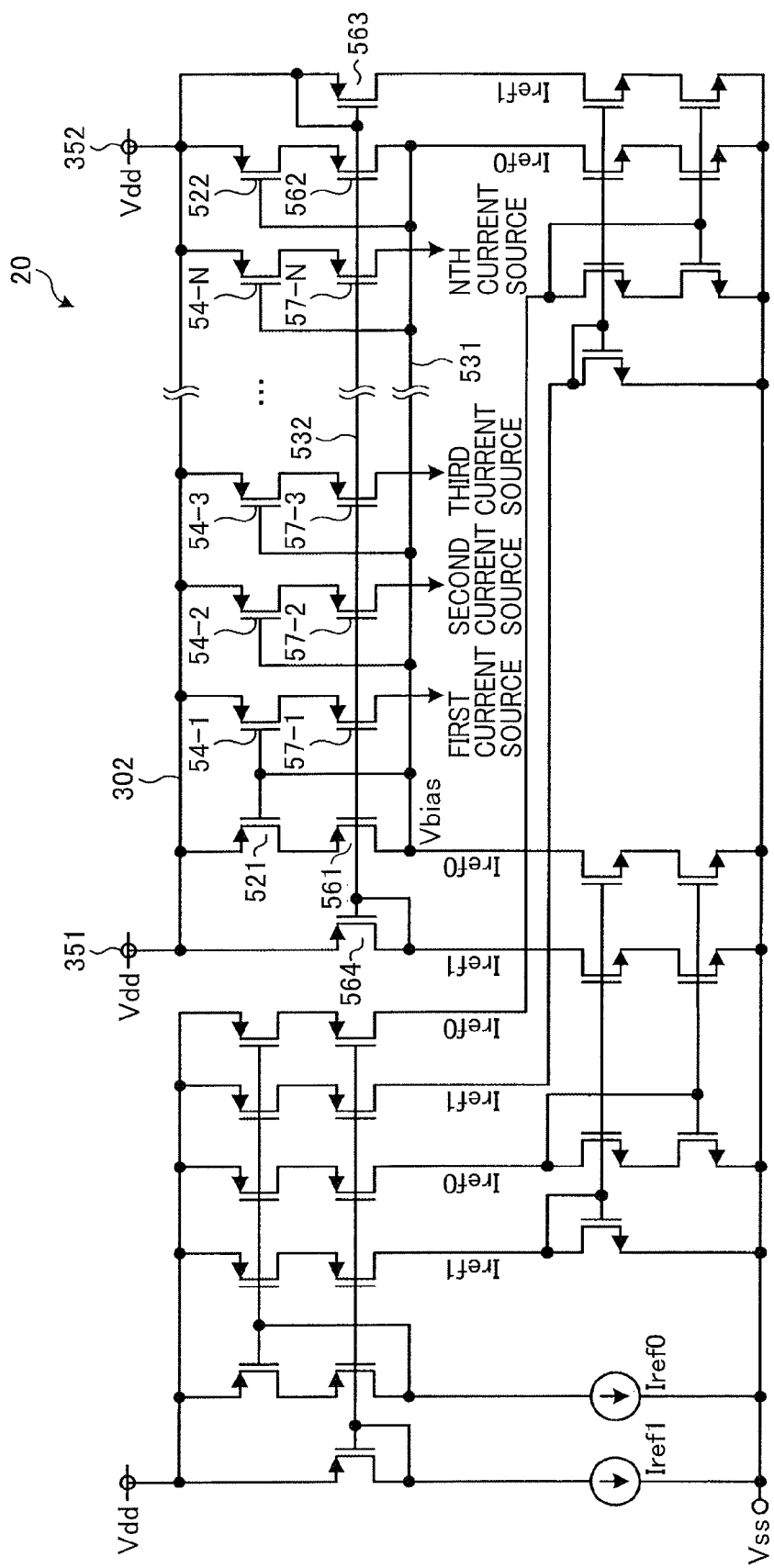
FIG. 6 is a diagram illustrating a configuration of a constant current source circuit included in the semiconductor integrated circuit as an embodiment of the present invention.

Next, a modified example of the constant current source circuit 20 in the semiconductor integrated circuit 1 in this embodiment is described below. FIG. 6 is a diagram illustrating a modified configuration of a constant current source circuit 20 included in the semiconductor integrated circuit 1 in this embodiment. In the modified configuration of the constant current source circuit 20 illustrated in FIG. 6, the basic current mirror circuit that functions as the bias source and the current source for the constant current source circuit 20 in FIG. 3 is replaced by a low-voltage cascode current mirror circuit that functions at low voltage (constructed by transistors 521, 522, 561, 562, 54-1 to 54-N, and 57-1 to 57-N) using the bias wirings 531 and 532. More specifically, the low-voltage cascode current mirror circuit that functions at low voltage (constructed by transistors 521, 522, 561, 562, 54-1 to 54-N, and 57-1 to 57-N) is a loop-back current mirror circuit. In the modified configuration of the constant current source circuit 20 illustrated in FIG. 6, since different current values may be used depending on design, reference current Iref0 is separated from reference current Iref1.

In the modified configuration of the constant current source circuit 20 illustrated in FIG. 6, by using the low-voltage cascode current mirror circuit, it is possible to reduce shift of mirroring accuracy due to λVds (channel length modulation effect). In addition, in the modified configuration of the constant current source circuit 20 illustrated in FIG. 6, the low-voltage cascode current mirror circuit that functions at low voltage is used. Therefore, it is possible to use the circuit by using a low-voltage power source circuit. It should be noted that, in the modified configuration of the constant current source circuit 20 illustrated in FIG. 6, transistors 563 and 564 are used in order to ensure saturated margin. As a result, the drain potential is fixed. It should be noted that, in the modified configuration of the constant current source circuit 20 illustrated in FIG. 6, the loop-back low-voltage cascode current mirror circuit is used. However, it is possible to use a normal single stage current mirror for the first stage (nch) and the second stage (pch) of the loop-back low-voltage cascode current mirror circuit.

Second Modification

Figure 7:
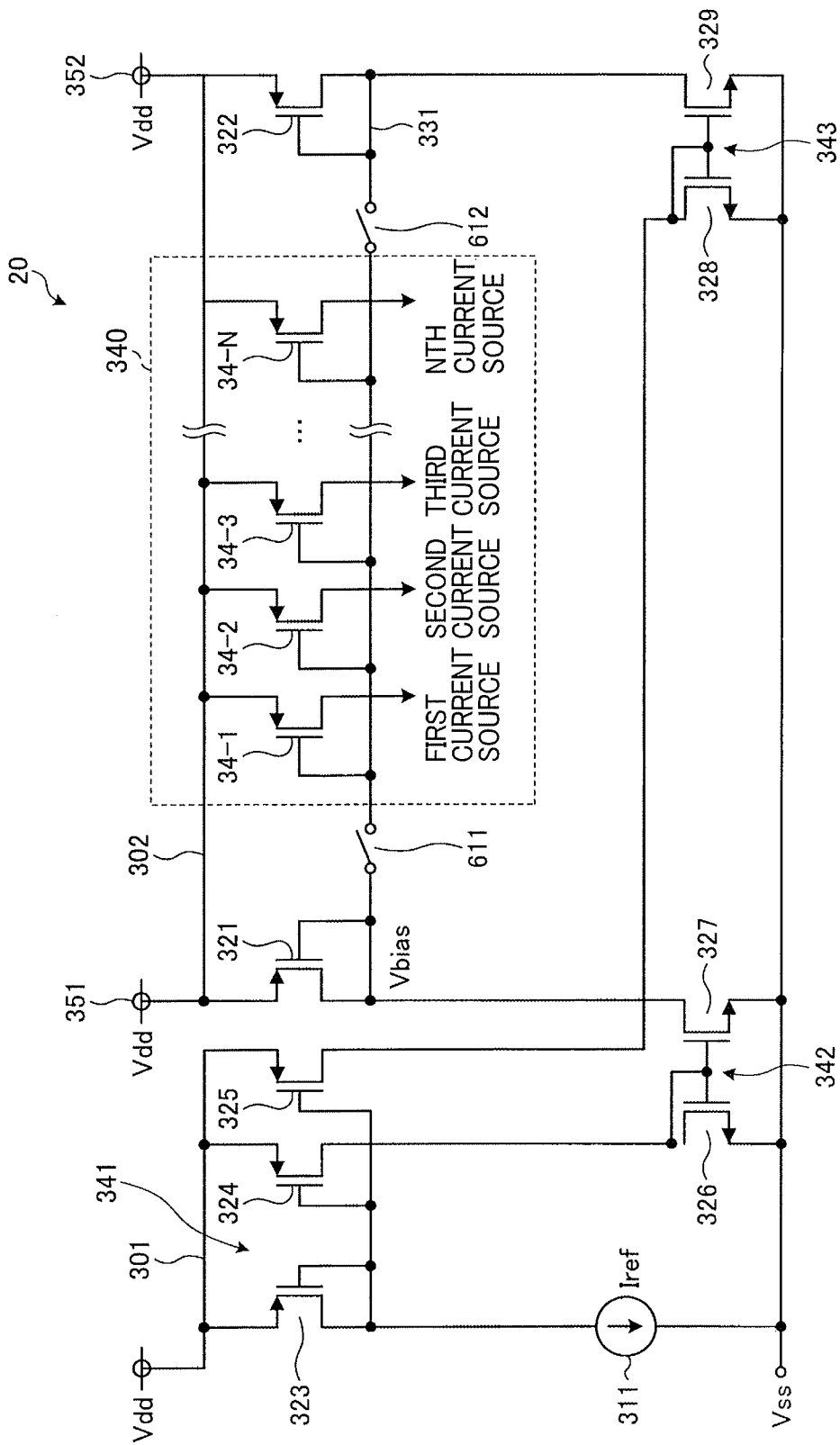
FIG. 7 is a diagram illustrating a configuration of a constant current source circuit included in the semiconductor integrated circuit as an embodiment of the present invention.

FIG. 7 is a diagram illustrating a modified configuration of a constant current source circuit 20 included in the semiconductor integrated circuit 1 in this embodiment. In the modified configuration of the constant current source circuit 20 illustrated in FIG. 7, a bias sample/hold (S/H) circuit is used. The modified configuration of the constant current source circuit 20 illustrated in FIG. 7, a first switch 611 connected between the row signal processing current source 340 and the first transistor 321 and a second switch 612 connected between the row signal processing current source 340 and the second transistor 322. More specifically, the first switch 611 turns on and off a connection between the first transistor 321 (the first bias source) and the bias wiring 331. The second switch 612 turns on and off a connection between the second transistor 322 (the second bias source) and the bias wiring 331. The first switch 611 and the second switch 612 are switches constructed by transistors.

The row signal processing current source 340 includes constant current source transistors 34-1 to 34-N. In starting correlation double sampling (CDS), the row signal processing current source 340 (row signal processing circuit 12) samples the current bias value and holds the current bias value while the CDS operation is performed. The first switch 611 and the second switch 612 are turned on simultaneously during the sampling period and turned off simultaneously during the holding period. As a result, the semiconductor integrated circuit 1 may isolate an element as the bias generating source that varies during the CDS period.

That is, in this modified configuration of the constant current source circuit 20 in the semiconductor integrated circuit 1, the gate of the current source is made into a floating (high impedance) state. Consequently, the bias current source is isolated from global and kept from being noisy. Timing of sampling and holding is different for each function block that the current source is used.

Third Modification

Figure 8:
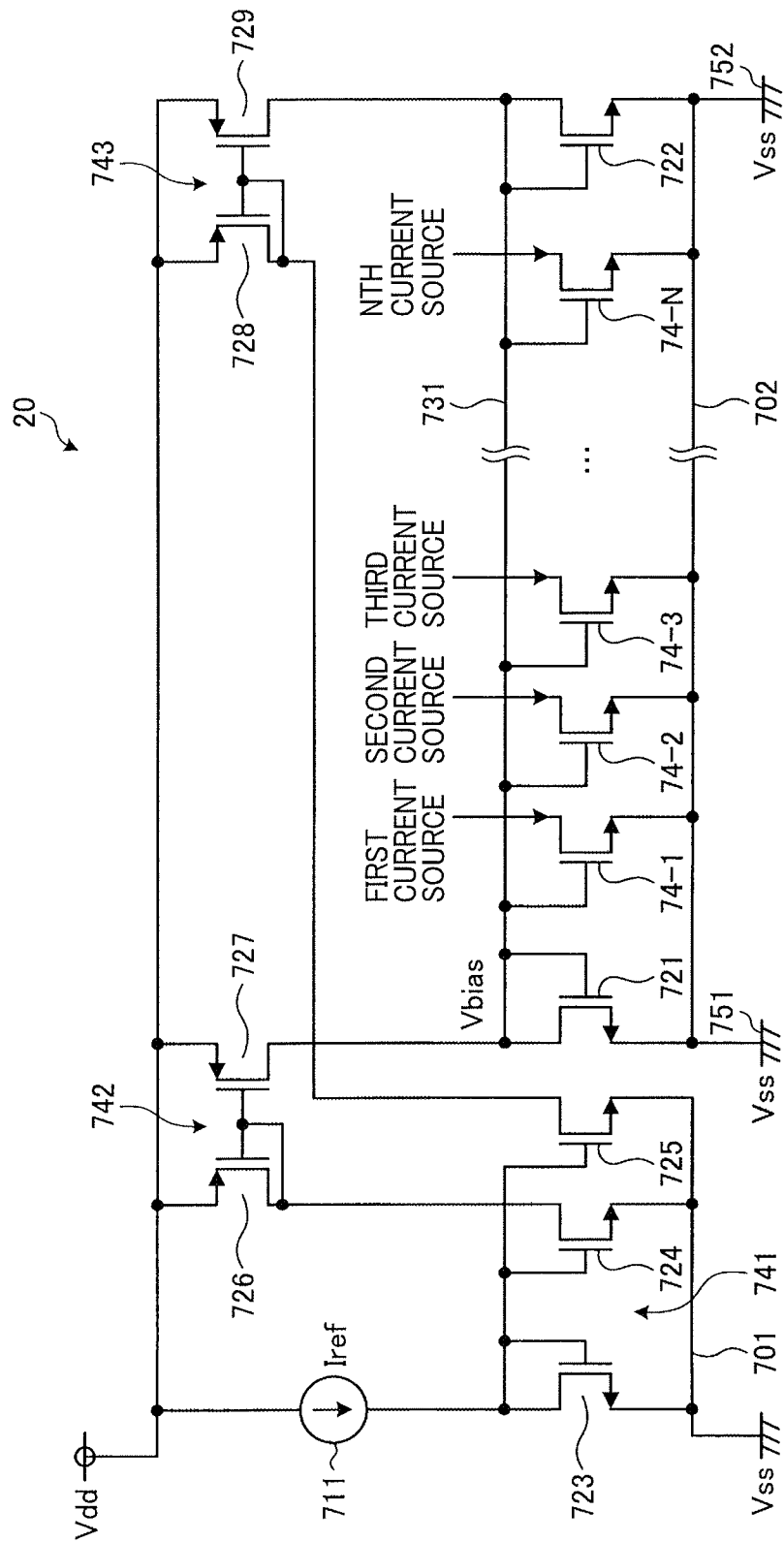
FIG. 8 is a diagram illustrating a configuration of a constant current source circuit included in the semiconductor integrated circuit as an embodiment of the present invention.

FIG. 8 is a diagram illustrating a modified configuration of a constant current source circuit 20 included in the semiconductor integrated circuit 1 in this embodiment. In the modified configuration of the constant current source circuit 20 illustrated in FIG. 8, compared to the constant current source circuit illustrated in FIG. 3, constant current source transistors (constant current sources) 74-1 to 74-N are constructed by NMOS transistors.

In the constant current source circuit 20, among two terminals of a reference current source 711 that supplies reference current Iref, one terminal is connected to power source voltage Vdd, and the other terminal is connected to a drain electrode and a gate electrode of a third transistor 723, a gate electrode of a fourth transistor 724, and a gate electrode of a fifth transistor 725.

In the constant current source circuit 20, source electrodes of the third transistor 723, the fourth transistor 724, and the fifth transistor 725 are connected to a first ground wiring 701 (ground potential Vss). In the constant current source circuit 20, a drain electrode of the fourth transistor 724 is connected to a drain electrode and a gate electrode of the sixth transistor 726 and a gate electrode of the seventh transistor 727. Likewise, in the constant current source circuit 20, a drain electrode of the fifth transistor 725 is connected to a drain electrode and a gate electrode of the eighth transistor 728 and a gate electrode of the ninth transistor 729.

In the constant current source circuit 20, drain electrodes of the seventh transistor 727 and the ninth transistor 729 are connected to the drain electrode and gate electrode of the first transistor 721, the drain electrode and gate electrode of the second transistor 722, and the bias wiring 731. In the constant current source circuit 20, the bias wiring 731 is connected to each row of gate electrodes of the constant current source transistors (constant current sources) 74-1 to 74-N laid out for each of the row signal processing circuits 12-1 to 12-N.

In the constant current source circuit 20, source electrodes of the six transistor 726, the seventh transistor 727, the eighth transistor 728, and the ninth transistor 729 are connected to the power source voltage Vdd. In the constant current source circuit 20, each of source electrodes of the first transistor 721, the second transistor 722, and the constant current source transistors 74-1 to 74-N is connected to a second ground wiring 702 (ground potential Vss).

The first ground wiring 701 is a ground wiring used globally. The second ground wiring 702 is used as a ground wiring for the constant current source circuit (the constant current source transistors 74-1 to 74-N, the first transistor 721, and the second transistor 722).

In the constant current source circuit 20, a first current mirror circuit 741 is constructed by the third transistor 723, the fourth transistor 724, and the fifth transistor 725. In addition, in the constant current source circuit 20, a second current mirror circuit 742 is constructed by the sixth transistor 726 and the seventh transistor 727, and a third current mirror circuit 743 is constructed by the eighth transistor 728 and the ninth transistor 729. It should be noted that input to the current mirror circuits 741 to 743 is provided by flowing current. Therefore, even if the wiring becomes longer, that is not affected by resistance, and transmission loss is kept smaller.

The second current mirror circuit 742 is located at one end of the array of the constant current source transistors (constant current sources) 74-1 to 74-N (signal processing circuit row). The third current mirror circuit 743 is located at the other end of the array of the constant current source transistors (constant current sources) 74-1 to 74-N and supplies copied reference current to the first transistor 721 and the second transistor 722. The first transistor 721 and the second transistor 722 determine bias voltage Vbias in accordance with the supplied current.

In the constant current source circuit 20, the bias voltage Vbias determined by the first transistor 721 and the second transistor 722 is applied to the gate electrodes of the constant current source transistors 74-1 to 74-N via the bias wiring 731. The constant current source transistors 74-1 to 74-N construct a constant current source that flows current determined by difference between the bias voltage Vbias and ground potential Vss 751 and 752, i.e., voltage between gate and source of a NMOS transistor Vgs. In the constant current source circuit 20, the constant current source constructed by each of the constant current source transistors 74-1 to 74-N is connected to a load circuit (row signal processing circuits 12-1 to 12-N) via the current mirror circuits 742 and 743. That is, the constant current transistors 74-1 to 74-N construct a first current source to an Nth current source.

As described above, by locating each of the voltage supplying sources at both ends of the array of the constant current source transistors 74-1 to 74-N, a current value that flows from each of the voltage supplying sources is reduced to half. As a result, in the constant current source circuit 20, it is possible to reduce IR drop calculated by multiplying current I that flows through the power source wiring by wiring resistance R drastically. Furthermore, in the constant current source circuit 20, by laying out the current mirror circuits 742 and 743 on both ends, even if a voltage value of one power supplying source differs from a voltage value of the other power supplying source due to any cause, it is possible to keep slippage between current that flows from the constant current source and the ideal current value small.

If current flows through the bias wiring 731, IR drop is generated. Therefore, wiring resistance of the bias wiring 731 is designed allowing a large margin. For example, width of the wiring is designed short.

Second Embodiment

Next, the second embodiment is described. It should be noted that the same symbols are assigned to the same parts as described in the first embodiment above and descriptions for those parts are omitted.

In this embodiment, the image capturing apparatus that includes the semiconductor integrated circuit 1 described in the first embodiment is described below. The image capturing apparatus in this embodiment may be applied to various image capturing apparatuses such as digital cameras and MFPs etc.

Figure 9:
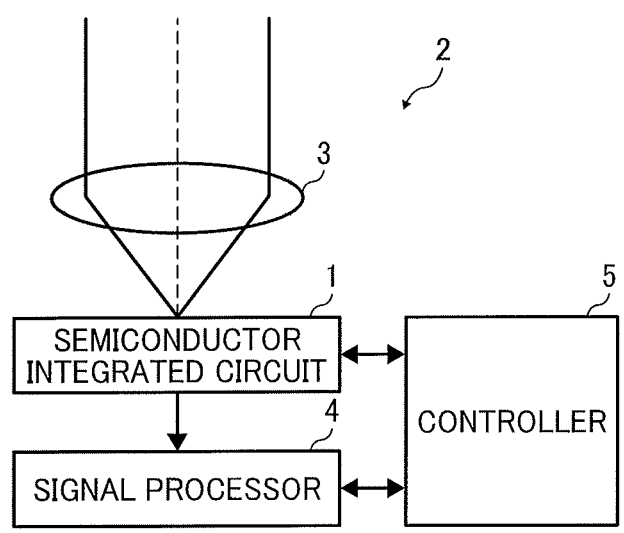
FIG. 9 is a schematic diagram illustrating a configuration of an image capturing apparatus as an embodiment of the present invention.

FIG. 9 is a schematic diagram illustrating a configuration of an image capturing apparatus 2 in this embodiment. As illustrated in FIG. 9, the image capturing apparatus 2 includes the semiconductor integrated circuit 1 described in the first embodiment, an optical system 3, a signal processor 4, and a controller 5.

An example of the optical system 3 is a lens that provides an image on the semiconductor integrated circuit 1 as the CMOS linear color image sensor.

The signal processor 4, which is implemented by an signal processing circuit, performs various signal processing operations on image signals output by the semiconductor integrated circuit 1. The controller 5, which is implemented by a central processing unit (CPU), controls the semiconductor integrated circuit 1 and the signal processor 4.

In the image capturing apparatus 2 in this embodiment described above, it is possible to reduce an amount that the current value of the constant current source included in each of the multiple row signal processing circuits laid out in one direction is misaligned due to voltage drop of IR product generated on the power source wiring.

As a result, the semiconductor integrated circuit and image capturing apparatus that may reduce an amount that the current value of the constant current source included in each of the multiple row signal processing circuits laid out in one direction is misaligned due to voltage drop of IR product generated on the power source wiring are provided.

In the above-described example embodiment, a computer can be used with a computer-readable program, described by object-oriented programming languages such as C++, Java (registered trademark), JavaScript (registered trademark), Perl, Ruby, or legacy programming languages such as machine language, assembler language to control functional units used for the apparatus or system. For example, a particular computer (e.g., personal computer, workstation) may control an information processing apparatus or an image processing apparatus such as image forming apparatus using a computer-readable program, which can execute the above-described processes or steps. In the above-described embodiments, at least one or more of the units of apparatus can be implemented as hardware or as a combination of hardware/software combination. The computer software can be provided to the programmable device using any storage medium or carrier medium for storing processor-readable code such as a floppy disk, a compact disk read only memory (CD-ROM), a digital versatile disk read only memory (DVD-ROM), DVD recording only/rewritable (DVD-R/RW), electrically erasable and programmable read only memory (EEPROM), erasable programmable read only memory (EPROM), a memory card or stick such as USB memory, a memory chip, a mini disk (MD), a magneto optical disc (MO), magnetic tape, a hard disk in a server, a solid state memory device or the like, but not limited these. Numerous additional modifications and variations are possible in light of the above teachings. It is therefore to be understood that within the scope of the appended claims, the disclosure of the present invention may be practiced otherwise than as specifically described herein.

For example, elements and/or features of different illustrative embodiments may be combined with each other and/or substituted for each other within the scope of this disclosure and appended claims.

The invention claimed is:

1. A semiconductor integrated circuit, comprising:
multiple signal processing circuits arranged in row along one direction, each signal processing circuit including a constant current source;
a first bias source disposed at one end of the row of the multiple signal processing circuits and to generate first bias voltage in accordance with supplied current;
a second bias source disposed at another end of the row of the multiple signal processing circuits and to generate second bias voltage in accordance with supplied current;
a first bias circuit to supply a first reference current to the first bias source;
a second bias circuit to supply a second reference current to the second bias source;
a bias wiring to supply the first bias voltage generated by the first bias voltage and the second bias voltage generated by the second bias voltage, respectively, to a plurality of gates of a transistor that constructs the constant current source;
a power source wiring to supply a power source voltage to each of the first bias source, the second bias source, and the constant current source;
a first voltage supplying source disposed at the one end of the row of the multiple signal processing circuits and to apply a first power source voltage to the power source wiring; and
a second voltage supplying source disposed at the other end of the row of the multiple signal processing circuits and to apply a second power source voltage to the power source wiring.

2. The semiconductor integrated circuit according to claim 1,
   wherein the power source wiring is separated from another wiring that supplies power source voltage to another circuit.

3. The semiconductor integrated circuit according to claim 1,
   wherein the signal processing circuit performs at least any one of analog signal processing operation, correlated double sampling processing operation, analog/digital conversion processing operation, and digital signal processing operation.

4. The semiconductor integrated circuit according to claim 1,
   wherein the constant current source supplies current to a load circuit via a current mirror circuit including two transistors whose size ratio is configured so that an input current becomes larger than an output current.

5. The semiconductor integrated circuit according to claim 1, further comprising:
   a first switch to turn on and off a first connection between the first bias source and the bias wiring; and
   a second switch to turn on and off a second connection between the second bias source and the bias wiring,
   wherein both the first switch and the second switch are simultaneously turned on during a sampling period and simultaneously turned off during a holding period.

6. An image capturing apparatus, comprising,
   the semiconductor integrated circuit according to claim 1 to perform photoelectric conversion;
   an optical system to form an image on the semiconductor integrated circuit;
   an image processor to perform various signal processing operations on an image signal output by the semiconductor integrated circuit; and
   a controller to control the semiconductor integrated circuit and the image processor.

* * * * *